(12) United States Patent
Lee

(10) Patent No.: US 7,208,381 B2
(45) Date of Patent: Apr. 24, 2007

(54) DOPING MASK AND METHODS OF MANUFACTURING CHARGE TRANSFER IMAGE DEVICE AND MICROELECTRONIC DEVICE USING THE SAME

(75) Inventor: Seok-ha Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 46 days.

(21) Appl. No.: 11/036,260

(22) Filed: Jan. 14, 2005

(65) Prior Publication Data

US 2005/0186745 A1    Aug. 25, 2005

(30) Foreign Application Priority Data

Feb. 24, 2004   (KR) .................... 10-2004-0012196

(51) Int. Cl.
*H01L 21/336* (2006.01)
(52) U.S. Cl. .................. 438/298; 438/48; 257/231
(58) Field of Classification Search ............. 438/48, 438/60, 69, 75, 298; 257/231, 232, 241
See application file for complete search history.

(56) References Cited

U.S. PATENT DOCUMENTS 5,444,007 A * 8/1995 Tsuchiaki ............... 438/421

6,436,729 B1   8/2002 Abe ....................... 438/60

FOREIGN PATENT DOCUMENTS

| JP | 2000-31466 | 1/2000 |
|---|---|---|
| KR | 10-2001-0006152 | 1/2001 |
| KR | 02-12907 | 2/2002 |

* cited by examiner

*Primary Examiner*—Phuc T. Dang
(74) *Attorney, Agent, or Firm*—Mills & Onello LLP

(57) ABSTRACT

Provided are a doping mask and methods of manufacturing a charge transfer image device and a microelectronic device using the same. The method includes forming a photoresist film on an entire surface of a substrate or sub-substrate having a peripheral circuit region and a pixel region, removing the photoresist film on an upper surface of the substrate intended for the peripheral circuit region and patterning the photoresist film on an upper surface of the substrate intended for the pixel region to form a photoresist pattern having an array of openings with a predetermined pitch, implanting ions at the same concentration level into the entire surface of the substrate using the photoresist pattern as a doping mask, and diffusing the implanted ions by annealing. The pitch is determined so that ions implanted through each opening diffuse toward those implanted through an adjacent one to form wells.

37 Claims, 4 Drawing Sheets

UNIT CELL

DOPING MASK AND METHODS OF MANUFACTURING CHARGE TRANSFER IMAGE DEVICE AND MICROELECTRONIC DEVICE USING THE SAME

This application claims the priority of Korean Patent Application No. 10-2004-0012196 filed on Feb. 24, 2004 in the Korean Intellectual Property Office, the contents of which are incorporated herein in their entirety by reference.

BACKGROUND OF THE INVENTION

1. Field of the Invention

The present invention relates to a doping mask and methods of manufacturing a charge transfer image device and a microelectronic device using the same.

2. Description of the Related Art

A charge transfer image device is a device that transfers a photoexcited signal charge, which is generated by incident light and stored in a light-receiving region, to an output region to generate a voltage, thereby outputting image information. The charge transfer image device is a charge-coupled device (CCD) which is an image sensor. According to a signal transfer principle of the charge transfer image device, all pixel signals are at a time transferred to a device except pixels in an analog manner and then are sequentially read out.

The CCD is classified into a frame transfer type and an interline transfer type according to the transfer principle used by the device.

The CCD has a uniformly arrayed structure of a plurality of metal oxide semiconductor (MOS) diodes or P/N junction photodiodes. A frame transfer type CCD includes a camera unit converting incident light to a signal charge, a storage unit storing the signal charge, a horizontal transfer unit transferring the signal charge horizontally, and an output amplifier.

An interline transfer type CCD includes a photodiode generating a signal charge according to the intensity of incident light, a vertical transfer channel transferring the signal charge in a vertical direction, a horizontal transfer channel transferring the signal charge received from the vertical transfer channel in a horizontal direction, and an output circuit unit detecting the signal charge received from the horizontal transfer channel.

The charge transfer image device includes a pixel region including a photodiode, a vertical transfer channel, and a horizontal transfer channel, and a peripheral circuit region including an input/output circuit unit and an amplification circuit unit.

Here, the pixel region and the peripheral circuit region surrounding the pixel region are formed on a single sub-substrate.

In detail, since an operation voltage is constantly applied to a N-type sub-substrate on which all chips are mounted, in forming P-wells in the N-type sub-substrate, a P-well of the peripheral circuit region must be formed at a higher concentration than that of the pixel region in order to be connected to ground.

In this respect, conventional P-type ion implantation is performed in a two-step process using two masks, one of which is formed on the entire surface of the N-type sub-substrate for a first step and the other is formed on a surface of the N-type sub-substrate intended for the peripheral circuit region for a second step.

However, such a two-step doping process using two masks is can have drawbacks and is not cost-effective.

SUMMARY OF THE INVENTION

The present invention provides a doping mask having a single mask pattern, which can form doping regions of different concentrations even when ion implantation is performed at the same concentration level.

The present invention also provides a method of manufacturing a charge transfer image device using the doping mask.

The present invention also provides a method of manufacturing a microelectronic device using the doping mask.

According to an aspect of the present invention, there is provided a doping mask comprising a photoresist pattern having an array of openings with a predetermined pitch to form wells in a substrate or sub-substrate for a microelectronic device, wherein the pitch is determined so that ions implanted through each opening diffuse toward those implanted through an adjacent opening in the substrate to form the wells. The terms "substrate" and "sub-substrate" will be used hereinafter interchangeably. That is, in accordance with the invention, a device formed on a sub-substrate can be formed on a substrate, and a method performed with a sub-substrate can be performed with a substrate.

In accordance with another aspect of the present invention, there is provided a method of manufacturing a charge transfer image device, which comprises forming a photoresist film on a surface of a substrate having a peripheral circuit region and a pixel region, removing the photoresist film on an upper surface of the substrate intended for the peripheral circuit region and patterning the photoresist film on an upper surface of the substrate intended for the pixel region to form a photoresist pattern having an array of openings with a predetermined pitch, implanting ions at the same concentration level into the entire surface of the substrate using the photoresist pattern as a doping mask, and diffusing the implanted ions by annealing.

The photoresist pattern may be formed such that a line array of openings is repeatedly arranged in the pixel region with a predetermined pitch.

Also, the photoresist pattern may be formed such that a lattice array of openings is repeatedly arranged in the pixel region with predetermined column and row pitches.

The photoresist pattern may have a zigzag array of the openings alternately repeatedly arranged with predetermined column and row pitches.

The doping concentration of the ions is preferably adjusted by adjusting the width of the openings without changing the pitch(es).

Also, the pitch may be determined so that ions implanted through each opening diffuse toward those implanted through an adjacent opening to form wells.

In accordance with another aspect of the present invention, there is provided a method of manufacturing a microelectronic device, which comprises forming a photoresist film on a surface of a substrate requiring a high concentration well and a low concentration well, removing the photoresist film on an upper surface of the substrate intended for the high concentration well and patterning the photoresist film on an upper surface of the substrate intended for the low concentration well to form a photoresist pattern having an array of openings with a predetermined pitch, implanting ions at the same concentration level into the surface of the substrate using the photoresist pattern as a doping mask, and diffusing the implanted ions.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

A charge transfer image device according to an embodiment of the present invention will be described with reference to FIGS. 1 and 2.

Figure 1:
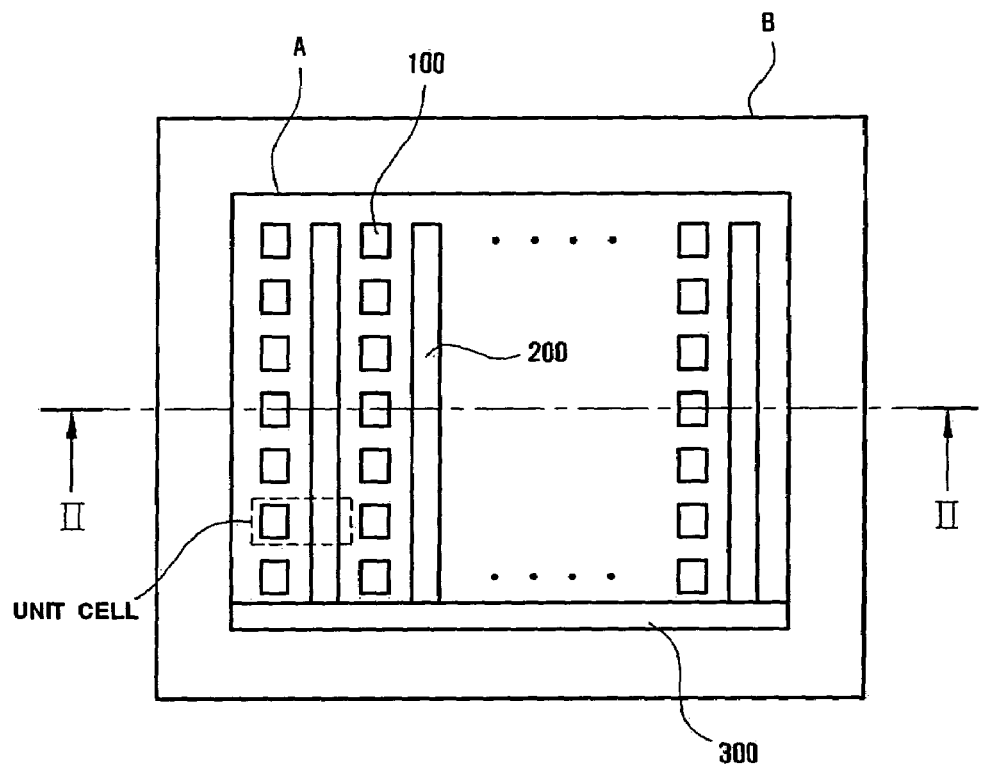
FIG. 1 is a plan view that schematically illustrates a charge transfer image device according to an embodiment of the present invention.
Figure 2:
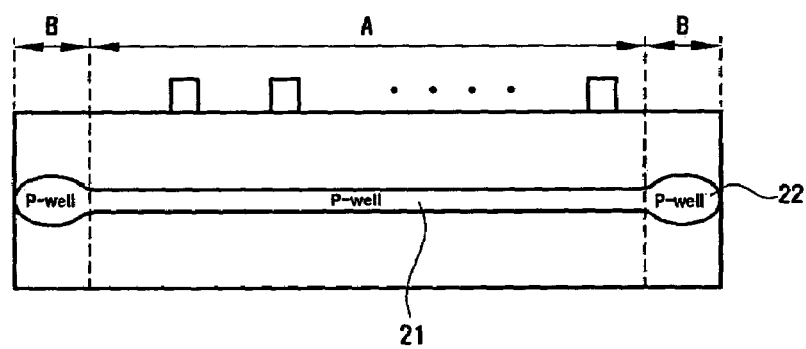
FIG. 2 is a sectional view taken along line II–II' in FIG. 1.

FIG. 1 is a plan view that schematically illustrates a charge transfer image device according to an embodiment of the present invention, and FIG. 2 is a sectional view taken along line II–II' in FIG. 1, in which a photodiode and a metal oxide semiconductor (MOS) structure constituting a charge transfer image device are omitted and a substrate and wells formed in the substrate are schematically illustrated.

Referring to FIGS. 1 and 2, a charge transfer image device according to an embodiment of the present invention includes a pixel region A and a peripheral circuit region B surrounding the pixel region A. The pixel region A includes a matrix array of a plurality of light-receiving units 100, a plurality of vertical transfer channels 200, each of which is formed in parallel with each column of the matrix array of the light-receiving units 100, and a horizontal transfer channel 300 formed at one end of the vertical transfer channels 200 to be perpendicular to the vertical transfer channels 200.

In one embodiment, each light-receiving unit 100 includes a photodiode (PD) generating a signal charge according to the intensity of incident light.

The vertical transfer channels 200 serve to transfer the signal charge generated and stored in the photodiode in a vertical direction. The horizontal transfer channel 300 serves to transmit the signal charge received from the vertical transfer channels 200 to a signal detection circuit as will be described below.

The peripheral circuit region B includes the signal detection circuit amplifying and outputting the signal charge received from the horizontal transfer channel 300, an input/output circuit, a protection circuit, and the like.

One of the light-receiving units 100 and its peripheral channel portion constitute a single unit cell.

The light-receiving units 100 have a limitation on a signal charge amount that can be stored in a potential well corresponding to the photodiode. For this reason, when portions of the light-receiving units 100 receive too much visible light, the amount of a signal charge generated in proportion to the intensity of the visible light may exceed the capacity of the potential well, and thus, effusion of the signal charge may occur.

When the effused signal charge enters a peripheral unit cell, a blooming phenomenon may occur in a highlight region, thereby creating a larger image. Furthermore, when the effused signal charge enters an adjacent channel, a smear phenomenon creating a continuous image may occur. To prevent these phenomena, an over-flow drain (OFD) structure as will be described later can be considered.

A unit cell of a charge transfer image device having an OFD structure according to an embodiment of the present invention will now be described with reference to FIG. 3.

Figure 3:
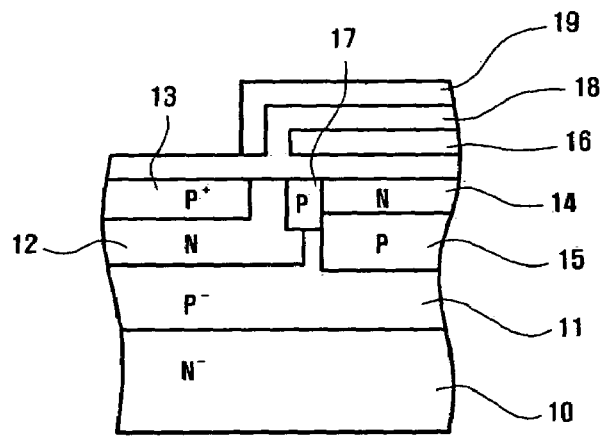
FIG. 3 is a sectional view that illustrates a unit cell of a charge transfer image device according to an embodiment of the present invention.

FIG. 3 is a sectional view that illustrates a unit cell of a charge transfer image device according to an embodiment of the present invention.

Referring to FIG. 3, a P-type well 11 used as a vertical over-flow barrier to prevent blooming is formed in a surface of an N-type semiconductor substrate 10. An N-type photodiode 12 is formed in the P-type well 11.

A high concentration P-type hole trap layer 13 is formed in a surface of the N-type photodiode 12. Between vertical arrays of the photodiode 12, a vertical transfer channel 14 is formed on a P-type second well 15. A P-type transfer channel 17 is formed between the P-type hole trap layer 13 and the vertical transfer channel 14 below a transfer electrode 16 which is a portion of a transfer gate (not shown).

The transfer electrode 16 is formed on the semiconductor substrate 10 via an insulating layer 18. The entire surface of the semiconductor substrate 10 except the photodiode 12 is covered with a light-shielding layer 19.

With this structure, when an OFD operation voltage is applied to the semiconductor substrate 10, a photoexcited charge is accumulated in the photodiode 12. When the amount of the accumulated charge exceeds a capacity of the potential well, an excess signal charge is effused over a potential barrier of the P-type well 11 and then enters the substrate 10.

Generally, since an OFD operation voltage is constantly applied to the N-type substrate 10 on which all chips are mounted, a P-well of the peripheral circuit region B is formed in a higher concentration than that of the pixel region A in order to be connected to ground. In this respect, in an initial well formation process for a charge transfer image device as shown in FIG. 2, a lower concentration P-well 21 and a higher concentration P-well 22 are respectively formed in the pixel region A and the peripheral circuit region B of the substrate 10.

The initial well formation process for a charge transfer image device according to an embodiment of the present invention as shown in FIG. 2 will now be described in more detail with reference to FIGS. 4 through 6.

Figure 4:
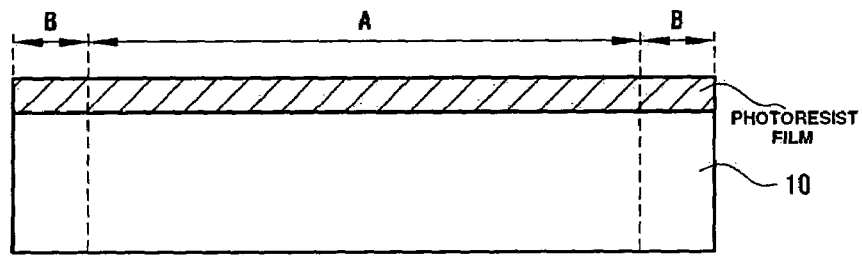
FIG. 4 is a sectional view that illustrates a first process for depositing a photoresist film on a substrate in a method of manufacturing a charge transfer image device according to an embodiment of the present invention.
Figure 5:
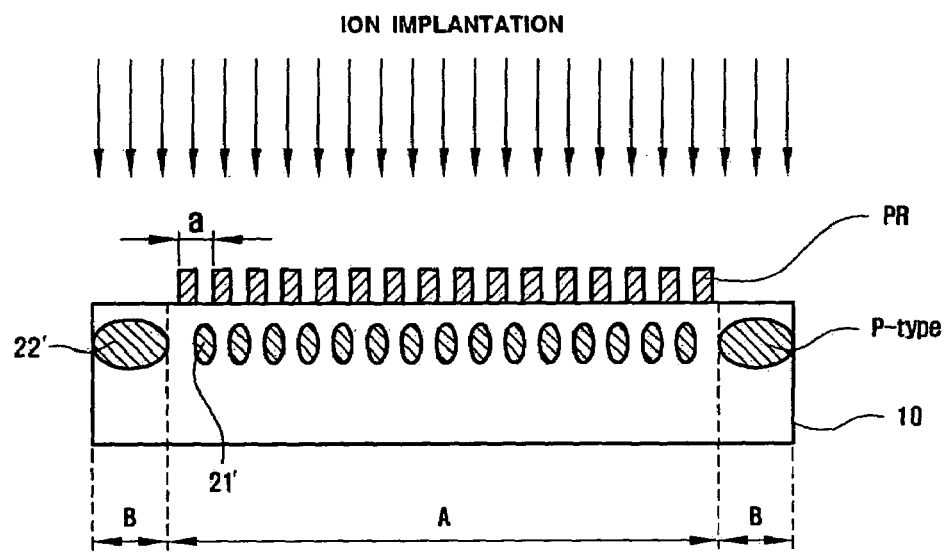
FIG. 5 is a sectional view that illustrates a process in which ion implantation is performed on the substrate using a pattern of the photoresist film.
Figure 6:
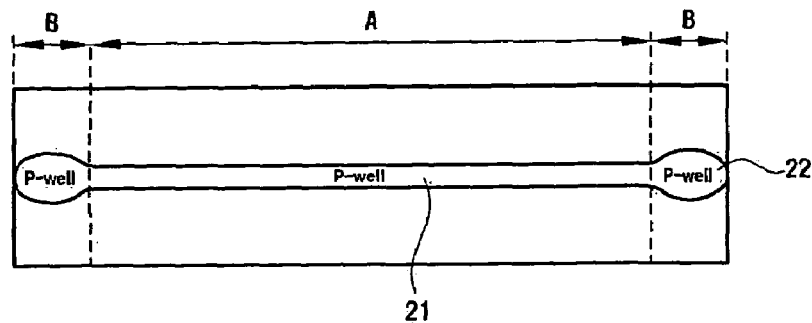
FIG. 6 is a sectional view that illustrates a process in which implanted ions are appropriately diffused by annealing to form wells.

FIG. 4 is a sectional view that illustrates a first process for depositing a photoresist film on a substrate in a method of manufacturing a charge transfer image device according to an embodiment of the present invention, FIG. 5 is a sectional view that illustrates a subsequent process to FIG. 4 in which ion implantation is performed on the substrate using a pattern of the photoresist film, and FIG. 6 is a sectional view that illustrates a subsequent process to FIG. 5 in which implanted ions are appropriately diffused by annealing to form wells.

Referring first to FIG. 4, a photoresist film is formed on an entire surface of a substrate 10 having a pixel region A and a peripheral circuit region B for a charge transfer image device.

Then, the photoresist film is patterned by photolithography, as shown in FIG. 5. In the pixel region A, a line-shaped photoresist pattern PR having a predetermined pitch a is formed. In the peripheral circuit region B, the photoresist film is removed. At this time, the photoresist pattern PR may be shaped in a lattice form or a zigzag form as described below.

Next, P-type ions are implanted into the substrate 10 having the peripheral circuit region B and the pixel region A using the photoresist pattern PR as a doping mask. In FIG. 5, a reference numeral 21'_indicates P-type ions doped in the pixel region A and a reference numeral 22' indicates P-type ions doped in the peripheral circuit region B.

Subsequently, referring to FIG. 6, the photoresist pattern PR is removed and the substrate 10 is annealed under the condition that the doped P-type ions 21' and 22' are appropriately diffused. That is, the concentration profiles of the P-type ions 21' are overlapped to form P-wells with predetermined concentrations by diffusion of the P-type ions 21' during the annealing. Therefore, a low concentration P-well 21 and a high concentration P-well 22 can be formed using a single mask pattern.

Figure 7:
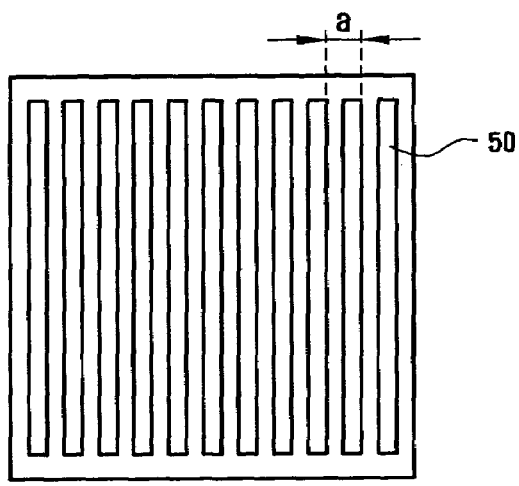
FIG. 7 is a plan view that illustrates a doping mask according to an embodiment of the present invention.
Figure 8:
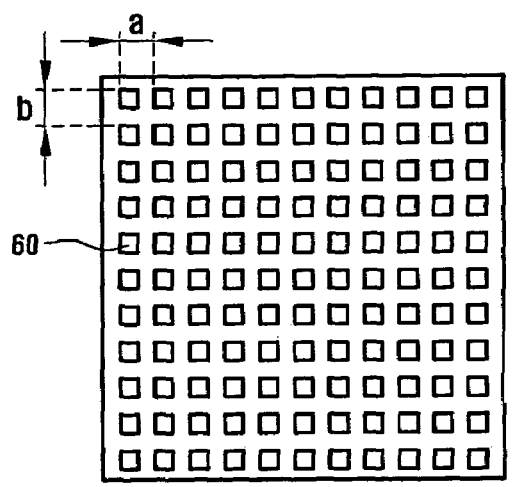
FIG. 8 is a plan view that illustrates a doping mask according to another embodiment of the present invention.
Figure 9:
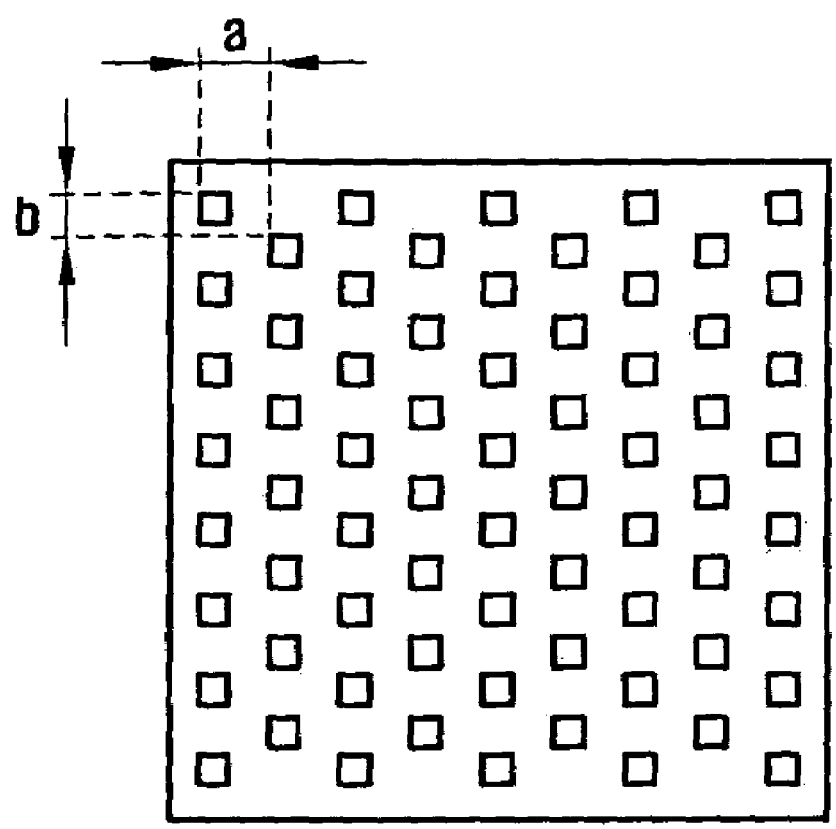
FIG. 9 is a plan view that illustrates a doping mask according to another embodiment of the present invention.

Hereinafter, doping masks having photoresist patterns according to embodiments of the present invention as shown in FIGS. 7 through 9 will be described in detail with reference to FIG. 6.

FIG. 7 is a plan view that illustrates a doping mask according to an embodiment of the present invention.

Referring to FIG. 7, a doping mask according an embodiment of the present invention has a line array of openings 50 with a predetermined pitch a.

Preferably, the pitch a of the doping mask is determined so that ions implanted through each opening diffuse toward those implanted through an adjacent opening during annealing to form wells.

In this respect, when ion implantation is performed at the same concentration level on the substrate 10 of a charge transfer image device using the doping mask according to this embodiment of the present invention followed by annealing, the P-well 21 of the pixel region A located below the doping mask having the line array of the openings 50 is formed at about a half of the concentration of the P-well 22 of the peripheral circuit region B.

Here, the concentration of the P-well 21 can be adjusted by adjusting the width of the openings 50. For example, when the width of the openings 50 increases without changing the pitch, the P-well 21 can be formed at more than a half of the concentration of the P-well 22.

FIG. 8 is a plan view that illustrates a doping mask according to another embodiment of the present invention.

The doping mask according to the embodiment of the present invention, as shown in FIG. 8, has a lattice array of predetermined-shaped openings 60 with predetermined column and row pitches b and a. In this case, the column pitch b and the row pitch a may be the same or different.

The openings 60 may have various shapes, for example, a square shape.

Preferably, the pitches b and a of the doping mask are determined so that ions implanted through each opening diffuse toward those implanted through an adjacent opening during annealing to form wells. In this respect, when ion implantation is performed at the same concentration level on the substrate 10 of a charge transfer image device using the doping mask according to this embodiment of the present invention followed by annealing, the P-well 21 of the pixel region A located below the doping mask having the lattice array of the predetermined-shaped, e.g., square, openings 60 can be formed at ¼ of the concentration of the P-well 22 of the peripheral circuit region B.

FIG. 9 is a plan view that illustrates a doping mask according to another embodiment of the present invention.

The doping mask according to the embodiment of the present invention, as shown in FIG. 9, has a zigzag array of predetermined-shaped openings with predetermined column and row pitches b and a. At this time, the column pitch b and the row pitch a may be the same or different.

The openings may have various shapes, for example, a square shape.

Preferably, the pitches b and a of the doping mask are determined so that ions implanted through each opening diffuse toward those implanted through an adjacent opening during annealing to form wells.

In this respect, when ion implantation is performed at the same concentration level on the substrate 10 of a charge transfer image device using the doping mask according to this embodiment of the present invention followed by annealing, the P-well 21 of the pixel region A located below the doping mask having the zigzag array of the predetermined-shaped openings can be formed at a lower concentration than the P-well 22 of the peripheral circuit region B.

Even though the present invention has been illustrated hitherto in terms of a charge transfer image device in which doping regions of different concentrations are formed using a single doping mask, it can also be applied in fabrication of all microelectronic devices requiring doping regions of different concentrations.

While the present invention has been particularly shown and described with reference to exemplary embodiments thereof, it will be understood by those of ordinary skill in the art that various changes in form and details may be made therein without departing from the spirit and scope of the present invention as defined by the following claims.

As apparent from the above description, according to the present invention, one-shot ion implantation of the same concentration using a doping mask with a line, lattice, or zigzag pattern can form wells of different concentrations.

Furthermore, since wells of different concentrations are formed using a single doping mask in fabrication of microelectronic devices or charge transfer image devices, the fabrication process can be simplified.

What is claimed is:

1. A method of manufacturing a charge transfer image device, which comprises:
    forming a photoresist film on a surface of a substrate having a peripheral circuit region and a pixel region;
    removing the photoresist film on an upper surface of the substrate intended for the peripheral circuit region and patterning the photoresist film on an upper surface of the substrate intended for the pixel region to form a photoresist pattern having an array of openings with a predetermined pitch;

implanting ions at the same concentration level into the surface of the substrate using the photoresist pattern as a doping mask; and diffusing the implanted ions by annealing to form a first well in the peripheral circuit region and a second well in the pixel region.

2. The method of claim 1, wherein the photoresist pattern is formed such that a line array of openings is repeatedly arranged in the pixel region with the predetermined pitch.

3. The method of claim 2, wherein the doping concentration of the ions is adjusted by adjusting the width of the openings without changing the predetermined pitch.

4. The method of claim 1, wherein the photoresist pattern is formed such that a lattice array of openings is repeatedly arranged in the pixel region with predetermined column and row pitches.

5. The method of claim 4, wherein the doping concentration of the ions is adjusted by adjusting the width of the openings without changing the predetermined column and row pitches.

6. The method of claim 4, wherein the column and row pitches are the same.

7. The method of claim 4, wherein the photoresist pattern is shaped in a square lattice.

8. The method of claim 1, wherein the photoresist pattern has a zigzag array of the openings alternately repeatedly arranged with predetermined column and row pitches.

9. The method of claim 8, wherein the doping concentration of the ions is adjusted by adjusting the width of the openings without changing the predetermined column and row pitches.

10. The method of claim 1, wherein the predetermined pitch is determined so that ions implanted through each opening diffuse toward those implanted through an adjacent opening to form the first and second wells.

11. The method of claim 2, wherein the predetermined pitch is determined so that ions implanted through each opening diffuse toward those implanted through an adjacent opening to form the first and second wells.

12. The method of claim 3, wherein the predetermined pitch is determined so that ions implanted through each opening diffuse toward those implanted through an adjacent opening to form the first and second wells.

13. The method of claim 4, wherein the predetermined pitch is determined so that ions implanted through each opening diffuse toward those implanted through an adjacent opening to form the first and second wells.

14. The method of claim 5, wherein the predetermined pitch is determined so that ions implanted through each opening diffuse toward those implanted through an adjacent opening to form the first and second wells.

15. The method of claim 6, wherein the predetermined pitch is determined so that ions implanted through each opening diffuse toward those implanted through an adjacent opening to form the first and second wells.

16. The method of claim 7, wherein the predetermined pitch is determined so that ions implanted through each opening diffuse toward those implanted through an adjacent opening to form the first and second wells.

17. The method of claim 8, wherein the predetermined pitch is determined so that ions implanted through each opening diffuse toward those implanted through an adjacent opening to form the first and second wells.

18. The method of claim 9, wherein the predetermined pitch is determined so that ions implanted through each opening diffuse toward those implanted through an adjacent opening to form the first and second wells.

19. A method of manufacturing a microelectronic device, which comprises:

forming a photoresist film on a surface of a substrate requiring a high concentration well and a low concentration well;

removing the photoresist film on an upper surface of the substrate intended for the high concentration well and patterning the photoresist film on an upper surface of the substrate intended for the low concentration well to form a photoresist pattern having an array of openings with a predetermined pitch;

implanting ions at the same concentration level into the surface of the substrate using the photoresist pattern as a doping mask; and diffusing the implanted ions.

20. The method of claim 19, wherein the photoresist pattern is formed such that a line array of openings is repeatedly arranged in the pixel region with a predetermined pitch.

21. The method of claim 20, wherein the doping concentration of the ions is adjusted by adjusting the width of the openings without changing the predetermined pitch.

22. The method of claim 19, wherein the photoresist pattern is formed such that a lattice array of openings is repeatedly arranged in the pixel region with predetermined column and row pitches.

23. The method of claim 22, wherein the doping concentration of the ions is adjusted by adjusting the width of the openings without changing the predetermined column and row pitches.

24. The method of claim 19, wherein the column and row pitches are the same.

25. The method of claim 19, wherein the photoresist pattern is shaped in a square lattice.

26. The method of claim 19, wherein the photoresist pattern has a zigzag array of the openings alternately repeatedly arranged with predetermined column and row pitches.

27. The method of claim 26, wherein the doping concentration of the ions is adjusted by adjusting the width of the openings without changing the predetermined column and row pitches.

28. The method of claim 19, wherein the predetermined pitch is determined so that ions implanted through each opening diffuse toward those implanted through an adjacent opening to form wells.

29. The method of claim 20, wherein the predetermined pitch is determined so that ions implanted through each opening diffuse toward those implanted through an adjacent opening to form wells.

30. The method of claim 21, wherein the predetermined pitch is determined so that ions implanted through each opening diffuse toward those implanted through an adjacent opening to form wells.

31. The method of claim 22, wherein the predetermined pitch is determined so that ions implanted through each opening diffuse toward those implanted through an adjacent opening to form wells.

32. The method of claim 23, wherein the predetermined pitch is determined so that ions implanted through each opening diffuse toward those implanted through an adjacent opening to form wells.

33. The method of claim 24, wherein the predetermined pitch is determined so that ions implanted through each opening diffuse toward those implanted through an adjacent opening to form wells.

34. The method of claim 25, wherein the predetermined pitch is determined so that ions implanted through each opening diffuse toward those implanted through an adjacent opening to form wells.

35. The method of claim 26, wherein the predetermined pitch is determined so that ions implanted through each opening diffuse toward those implanted through an adjacent opening to form wells.

36. The method of claim 27, wherein the predetermined pitch is determined so that ions implanted through each opening diffuse toward those implanted through an adjacent opening to form wells.

37. The method of claim 1, wherein the concentration of the well in the peripheral circuit region is higher than the concentration of the well in the pixel region.

\* \* \* \* \*